(12) United States Patent
Musselman

(10) Patent No.: US 11,056,405 B2
(45) Date of Patent: Jul. 6, 2021

(54) METHODS AND SYSTEMS FOR CONTROLLING WAFER FABRICATION PROCESS

(71) Applicant: Lam Research Corporation, Fremont, CA (US)

(72) Inventor: Marcus Musselman, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 49 days.

(21) Appl. No.: 16/131,464

(22) Filed: Sep. 14, 2018

(65) Prior Publication Data

US 2020/0091017 A1 Mar. 19, 2020

(51) Int. Cl.
*H01L 21/66* (2006.01)
*H01L 21/67* (2006.01)
*H01J 37/32* (2006.01)
*G06N 20/00* (2019.01)

(52) U.S. Cl.
CPC .......... *H01L 22/20* (2013.01); *H01J 37/3211* (2013.01); *H01J 37/32091* (2013.01); *H01J 37/32183* (2013.01); *H01J 37/32568* (2013.01); *H01L 21/67069* (2013.01); *H01L 21/67103* (2013.01); *H01L 21/67253* (2013.01); *G06N 20/00* (2019.01); *H01J 37/3244* (2013.01); *H01J 37/32715* (2013.01)

(58) Field of Classification Search
None
See application file for complete search history.

(56) References Cited

U.S. PATENT DOCUMENTS 8,964,178 B2* 2/2015 Cohen ................... G01B 11/24
356/369
2016/0370796 A1* 12/2016 Musselman ...... G05B 19/41875

* cited by examiner

*Primary Examiner* — Alexander G Ghyka
(74) *Attorney, Agent, or Firm* — Penilla IP, APC

(57) ABSTRACT

A method for controlling a semiconductor fabrication process includes determining a representative feature within a given area on a wafer. The representative feature has a critical dimension (CD) response to a specified process control parameter that is correlated to a CD response to the specified process control parameter of other features within the given area on the wafer. A CD adjustment is determined for the representative feature to achieve a target CD for the representative feature. The CD response to the specified process control parameter for the representative feature and the CD adjustment for the representative feature are used to determine an adjustment to the specified process control parameter that will drive a CD of the representative feature to the target critical dimension for the representative feature. A process controller is updated to implement the adjustment to the specified process control parameter during subsequent processing of another wafer.

16 Claims, 6 Drawing Sheets

METHODS AND SYSTEMS FOR CONTROLLING WAFER FABRICATION PROCESS

BACKGROUND

1. Field of the Disclosure

The present disclosure relates to semiconductor device fabrication.

2. Description of the Related Art

In semiconductor device fabrication, a semiconductor wafer ("wafer" hereafter) is subjected to various fabrication processes (such as plasma etching, atomic layer deposition (ALD), chemical vapor deposition (CVD), plasma enabled chemical vapor deposition (PECVD), etc.) that each include one or more process control parameters that can affect process results achieved on the wafer. Some process results are characterized by one or more critical dimensions (CDs), where a given CD of a particular fabrication step usually corresponds to a feature geometry that is to be controlled to ensure proper manufacturing and functionality of the resulting integrated circuit. It is of interest to know how various process control parameters affect a given CD within a particular fabrication step. It is also of interest to know how to adjust a setting of a given process control parameter to achieve a desired CD value within a particular fabrication step. It is within this context that the present invention arises.

SUMMARY

In an example embodiment, a method is disclosed for controlling a semiconductor fabrication process. The method includes determining a representative feature within a given area on a wafer. The representative feature has a critical dimension response to a specified process control parameter that is correlated to a critical dimension response to the specified process control parameter of other features within the given area on the wafer. The method also includes determining a critical dimension adjustment for the representative feature to achieve a target critical dimension for the representative feature. The method also includes using the critical dimension response to the specified process control parameter for the representative feature and the critical dimension adjustment for the representative feature to determine an adjustment to the specified process control parameter that will drive a critical dimension of the representative feature to the target critical dimension for the representative feature. The method also includes updating a process controller to implement the adjustment to the specified process control parameter during subsequent processing of another wafer.

In an example embodiment, a process controller for controlling a semiconductor fabrication process is disclosed. The process controller includes a critical dimension determination component configured to direct measurement of a critical dimension of a representative feature within a given area on a first wafer after completion of a fabrication process on the first wafer. The representative feature has a critical dimension response to a specified process control parameter that is correlated to a critical dimension response to the specified process control parameter of other features within the given area on the first wafer. The process controller also includes a process adjustment component configured to determine an adjustment to the specified process control parameter that will move the measured critical dimension of the representative feature within the given area on the first wafer toward a target critical dimension for the representative feature. The process controller also includes a process control component configured to direct performance of the fabrication process on a second wafer using the adjustment to the specified process control parameter. A configuration of the second wafer upon entering the fabrication process is equal to a configuration of the first wafer upon entering the fabrication process.

In an example embodiment, a method is disclosed for controlling a semiconductor fabrication process. The method includes having a relationship between a set of parametric data and one or more post-process geometric parameters on a wafer. The post-process geometric parameters exist on the wafer after performance of a fabrication process on the wafer. The set of parametric data includes one or more pre-process geometric parameters on the wafer. The pre-process geometric parameters exist on the wafer before performance of the fabrication process on the wafer. The set of parametric data also includes one or more process control parameters that are controlled during performance of the fabrication process on the wafer. The method also includes measuring values of the one or more pre-process geometric parameters on the wafer before performance of the fabrication process on the wafer. The method also includes using the relationship between the set of parametric data and one or more post-process geometric parameters on the wafer to determine a recommended setting of each of the one or more process control parameters for driving the one or more post-process geometric parameters on the wafer to respective target values. The method also includes performing the fabrication process on the wafer using the recommended setting of each of the one or more process control parameters.

In an example embodiment, a process controller for controlling a semiconductor fabrication process is disclosed. The process controller includes a pre-process geometric parameter data acquisition component configured to direct measurement of one or more pre-process geometric parameters on a wafer before performance of a fabrication process on the wafer. The process controller also includes a process adjustment component configured to use a process control model to determine a recommended setting of each of one or more process control parameters for driving one or more post-process geometric parameters on the wafer to respective target values in view of measured values for the one or more pre-process geometric parameters on the wafer. The one or more process control parameters are controlled during performance of the fabrication process on the wafer. The one or more post-process geometric parameters exist on the wafer after performance of the fabrication process on the wafer. The process controller also includes a process control component configured to direct performance of the fabrication process on the wafer using the recommended setting of each of the one or more process control parameters.

DETAILED DESCRIPTION

In the following description, numerous specific details are set forth in order to provide an understanding of embodiments of the present disclosure. It will be apparent, however, to one skilled in the art that embodiments the present disclosure may be practiced without some or all of these specific details. In other instances, well known process operations have not been described in detail in order not to unnecessarily obscure the present disclosure.

The methods and systems disclosed herein can be utilized in essentially any wafer fabrication process and associated system. However, to facilitate description, various embodiments of methods and systems are disclosed herein with reference to a plasma-based wafer fabrication process. In the semiconductor industry, wafers can undergo fabrication operations in various types of plasma chambers, such as capacitively coupled plasma (CCP) processing chambers and inductively coupled plasma (ICP) plasma processing chambers. In both CCP and ICP processing chambers, radiofrequency (RF) power is used to energize a process gas to transform the process gas into a plasma within a plasma processing region to which the wafer is exposed. Reactive species and/or charged species within the plasma interact with the wafer to modify a condition of the wafer, such as by modifying a material present on the wafer, or by depositing material on the wafer, or by removing/etching material from the wafer, by way of example. The CCP and ICP processing chambers can be equipped with one or more electrodes that receive RF power for generating the plasma within the plasma processing region. Also, the CCP and ICP processing chambers can be equipped with one or more electrodes that receive RF power and/or direct current (DC) power to generate a bias voltage at the wafer location for attracting charged species from the plasma toward the wafer. Also, in some embodiments, the CCP and ICP processing chambers can be equipped with one or more electrically powered components, such as a heater assembly, that receive electrical power from one or more power supplies, where each of the one or more power supplies is either a DC power supply or an AC (alternating current) power supply.

Figure 1A:
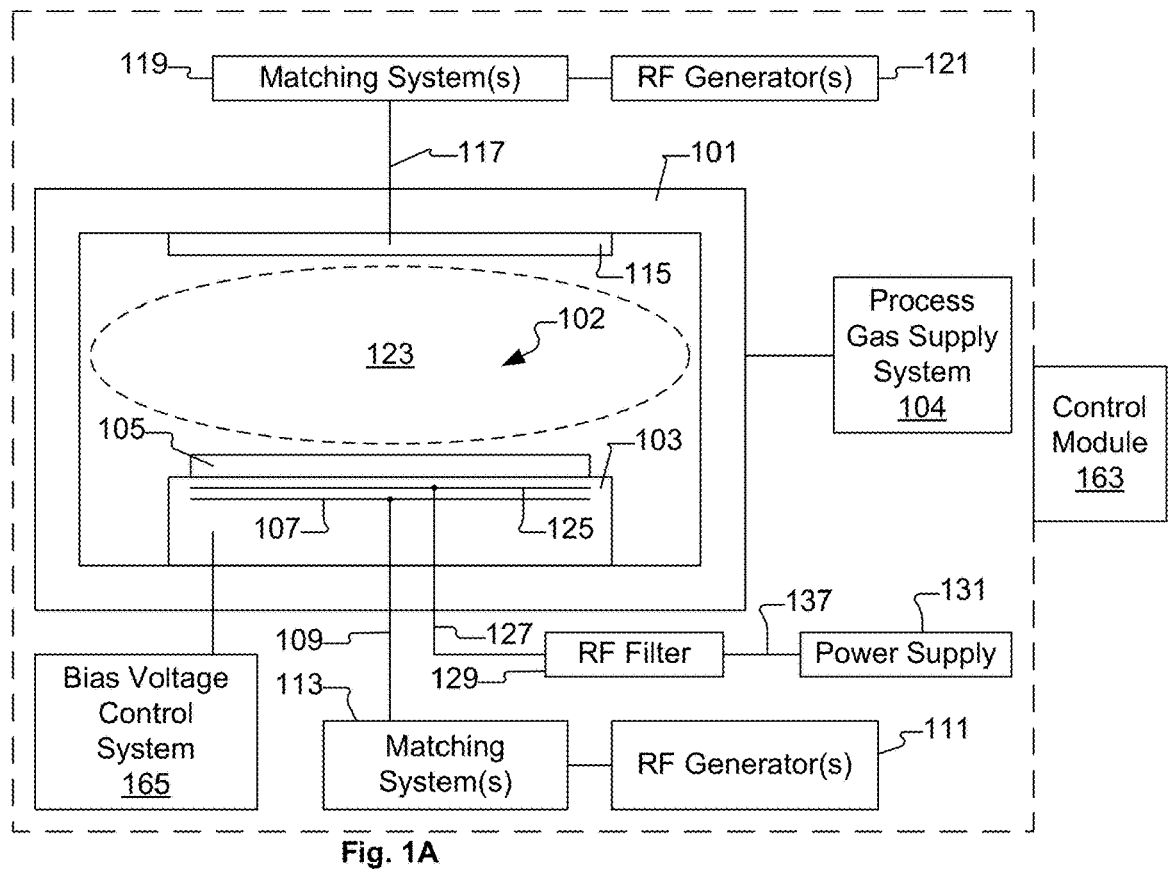
FIG. 1A shows an example vertical cross-section diagram of a CCP processing chamber, in accordance with some embodiments of the present disclosure.

FIG. 1A shows an example vertical cross-section diagram of a CCP processing chamber 101, in accordance with some embodiments of the present disclosure. The CCP processing chamber 101 includes a plasma processing region 102 within which a plasma 123 is generated in exposure to a wafer 105 to affect a change to the wafer 105 in a controlled manner. In various fabrication processes, the change to the wafer 105 can be a change in material or surface condition on the wafer 105. For example, in various fabrication processes, the change to the wafer 105 can include one or more of etching of a material from the wafer 105, deposition of a material on the wafer 105, or modification of material present on the wafer 105. In some embodiments, the wafer 105 is a semiconductor wafer undergoing a fabrication procedure. However, it should be understood that in various embodiments, the wafer 105 can be essentially any type of substrate that is subjected to a plasma-based fabrication process. For example, in some embodiments, the wafer 105 as referred to herein can be a substrate formed of silicon, sapphire, GaN, GaAs or SiC, or other substrate materials, and can include glass panels/substrates, metal foils, metal sheets, polymer materials, or the like. Also, in various embodiments, the wafer 105 as referred to herein may vary in form, shape, and/or size. For example, in some embodiments, the wafer 105 referred to herein may correspond to a circular-shaped semiconductor wafer on which integrated circuit devices are manufactured. In various embodiments, the circular-shaped semiconductor wafer can have a diameter of 200 mm (millimeters), 300 mm, 450 mm, or of another size. Also, in some embodiments, the wafer 105 referred to herein may correspond to a non-circular substrate, such as a rectangular substrate for a flat panel display, or the like, among other shapes.

The CCP processing chamber 101 is connected to a process gas supply system 104, such that one or more process gas(es) can be supplied in a controlled manner to the plasma processing region 102. It should be understood that the process gas supply system 104 includes one or more process gas sources and an arrangement of valves and mass flow controllers to enable provision of the one or more process gas(es) to the plasma processing region 102 with a controlled flow rate and with a controlled flow time. In various embodiments, the CCP processing chamber 101 operates by having the process gas supply system 104 deliver one or more process gases into the plasma processing region 102, and by applying RF power to the one or more process gases to transform the one or more process gases into the plasma 123 in exposure to the wafer 105, in order to cause a change in material or surface condition on the wafer 105.

The CCP processing chamber 101 includes a wafer support structure 103 upon which the wafer 105 is positioned and supported during processing operations. In some embodiments, an electrode 107 is disposed within the wafer support structure 103 to provide for transmission of RF power from the electrode 107 through the plasma processing region 102 to generate the plasma 123 and/or control ion energy. The electrode 107 is connected to receive RF power through an RF feed structure 109, which is connected to one or more RF power generator(s) 111 by way of one or more impedance matching system(s) 113. The impedance matching system(s) 113 include an arrangement of capacitors and inductors configured to ensure that an impedance seen by the RF power generator(s) 111 at the input of the impedance matching system(s) 113 is sufficiently close to an output impedance for which the RF power generator(s) 111 is designed to operate (usually 50 Ohm), so that RF power generated and transmitted by the RF power generator(s) 111 will be transmitted into the plasma processing region 102 in an efficient manner, e.g., without unacceptable or undesirable reflection.

Also, in some embodiments, the CCP processing chamber 101 can include an upper electrode 115. In various embodiments, the upper electrode 115 can provide either an electrical ground electrode or can be used to transmit RF power into the plasma processing region 102. For example, in some embodiments, the upper electrode 115 is connected to a reference ground potential, such that the upper electrode 115 provides a return path for RF signals transmitted into the plasma processing region 102 from the electrode 107. Alternatively, in some embodiments, the upper electrode 115 is connected to receive RF power through an RF feed structure 117, which is connected to one or more RF power generator(s) 121 by way of one or more impedance matching system(s) 119. The impedance matching system(s) 119 include an arrangement of capacitors and inductors configured to ensure that an impedance seen by the RF power generator(s) 121 at the input of the impedance matching system(s) 119 is sufficiently close to an output impedance for which the RF powers generator(s) 121 is designed to operate (usually 50 Ohm), so that RF power generated and transmitted by the RF power generator(s) 121 will be transmitted into the plasma processing region 102 in an efficient manner, e.g., without unacceptable or undesirable reflection.

In some embodiments, a heater assembly 125 is disposed within the wafer support structure 103 to provide temperature control of the wafer 105. The heater assembly 125 is electrically connected to receive electrical power through an electrical connection 127, where the electrical power is supplied from a power supply 131 through an electrical connection 137 to an RF filter 129, and through the RF filter 129 to the electrical connection 127. In some embodiments, the power supply 131 is an alternating current (AC) power supply. In some embodiments, the power supply 131 is a direct current (DC) power supply. In some embodiments, the heater assembly 125 includes a plurality of electrical resistance heating elements. The RF filter 129 is configured to prevent RF power from entering the power supply 131, while allowing transmission of electrical current between the power supply 131 and the electrical connection 127. In some embodiments, the heater assembly 125 includes a two-dimensional array of heating elements distributed horizontally across the wafer support structure 103, to enable temperature control of the wafer 105 in a two-dimensional manner relative to a bottom surface of the wafer 105. In some embodiments, the heater assembly 125 and/or other process system components can be implemented with a localized control system, such as with the Hydra® Uniformity System of Lam Research Corporation, that utilizes specialized computer hardware and software to provide localized fine tuning of process control parameters relative to the wafer 105 to enable minimization of process result(s) variation across the wafer 105.

Also, in some embodiments, a bias voltage control system 165 is connected to the wafer support structure 103 within the CCP processing chamber 101. In some embodiments, the bias voltage control system 165 is connected to one or more bias voltage electrodes disposed within the wafer support structure 103 to control a bias voltage present at the location of the wafer 105. The bias voltage can be controlled to attract charged constituents of the plasma 123 toward the wafer 105 and thereby control energy and directionality of the charged constituents of the plasma 123. For example, the bias voltage control system 165 can be operated to accelerate ions in the plasma 123 toward the wafer 105 to perform an anisotropic etch on the wafer 105.

Figure 1B:
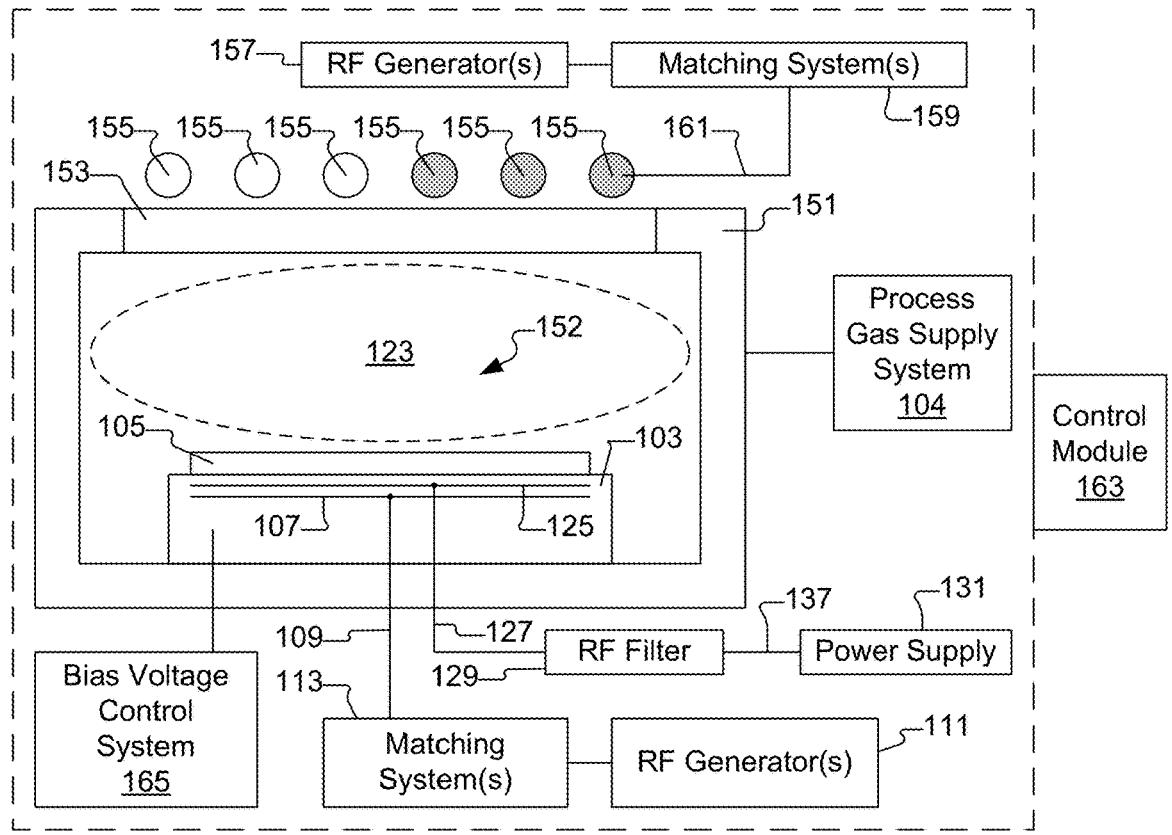
FIG. 1B shows an example vertical cross-section diagram of an ICP processing chamber, in accordance with some embodiments of the present disclosure.

FIG. 1B shows an example vertical cross-section diagram of an ICP processing chamber 151, in accordance with some embodiments of the present disclosure. The ICP processing chamber can also be referred to as a transformer coupled plasma (TCP) processing chamber. For ease of discussion herein, ICP processing chamber will be used to refer to both ICP and TCP processing chambers. The ICP processing chamber 151 includes a plasma processing region 152 in which the plasma 123 is generated in exposure to the wafer 105 to affect a change to the wafer 105 in a controlled manner. In various fabrication processes, the change to the wafer 105 can be a change in material or surface condition on the wafer 105. For example, in various fabrication processes, the change to the wafer 105 can include one or more of etching of a material from the wafer 105, deposition of a material on the wafer 105, or modification of material present on the wafer 105. It should be understood that the ICP processing chamber 151 can be any type of ICP processing chamber in which RF power is transmitted from a coil 155 disposed outside the ICP processing chamber 151 to a process gas within the ICP processing chamber 151 to generate the plasma 123 within the plasma processing region 152. An upper window structure 153 is provided to allow for transmission of RF power from the coil 155 through the upper window structure 153 and into the plasma processing region 152 of the ICP processing chamber 151.

The ICP processing chamber 151 is connected to the process gas supply system 104, such that one or more process gas(es) can be supplied in a controlled manner to the plasma processing region 152. The ICP processing chamber 151 operates by having the process gas supply system 104 flow one or more process gases into the plasma processing region 152, and by applying RF power from the coil 155 to the one or more process gases to transform the one or more process gases into the plasma 123 in exposure to the wafer 105, in order to cause a change in material or surface condition on the wafer 105. The coil 155 is disposed above the upper window structure 153. In the example of FIG. 1B, the coil 155 is formed as a radial coil assembly, with the shaded parts of the coil 155 turning into the page of the drawing and with the unshaded parts of the coil 155 turning out of the page of the drawing. It should be understood, however, that in other embodiments the coil 155 can have essentially any configuration that is suitable for transmitting RF power through the upper window structure 153 and into the plasma processing region 152. In various embodiments, the coil 155 can have any number of turns and any cross-section size and shape (circular, oval, rectangular, trapezoidal, etc.) as appropriate to provide the desired transmission of RF power through the upper window structure 153 into the plasma processing region 152.

The coil 155 is connected through an RF power supply structure 161 to one or more RF power generator(s) 157 by way of one or more impedance matching system(s) 159. The impedance matching system(s) 159 includes an arrangement of capacitors and/or inductors configured to ensure that an impedance seen by the RF power generator(s) 157 at the input of the impedance matching system(s) 159 is sufficiently close to an output impedance for which the RF power generator(s) 157 is designed to operate (usually 50 Ohms), so that RF power supplied to the coil 155 by the RF power generator(s) 157 will be transmitted into the plasma processing region 152 in an efficient manner, i.e., without unacceptable or undesirable reflection. Also, in some embodiments, the ICP processing chamber 151 can include the electrode 107, the RF feed structure 109, the impedance matching system(s) 113, and the RF power generator(s) 111, as previously described with regard to FIG. 1A.

Also, in some embodiments, the ICP processing chamber 151 can include the heater assembly 125 disposed within the wafer support structure 103 to provide temperature control of the wafer 105. As described with regard to the CCP processing chamber 101 of FIG. 1A, the heater assembly 125 of the ICP processing chamber 151 is electrically connected to receive electrical power through the electrical connection 127, where the electrical power is supplied from the power supply 131 through the electrical connection 137 to the RF filter 129, and through the RF filter 129 to the electrical connection 127. Also, in some embodiments, the bias voltage control system 165 is connected to the wafer support structure 103 within the ICP processing chamber 151.

A control module 163 is configured and connected to provide for control of plasma process operations performed in the CCP processing chamber 101 and of the ICP processing chamber 151. In some embodiments, the control module 163 is implemented as a combination of computer hardware and software. The control module 163 can be configured and connected to provide for control of essentially any system or component associated with the CCP processing chamber 101 and/or the ICP processing chamber 151. For example, the control module 163 can be configured and connected to control the process gas supply system 104, the RF generator(s) 111, the impedance matching system(s) 113, the RF generator(s) 121, the impedance matching system(s) 119, the power supply 131 for the heater assembly 125, the bias voltage control system 165, the RF generator(s) 157, the impedance matching system(s) 159, and/or any other system or component.

Also, the control module 163 can be connected and configured to receive signals from various components, sensors, and monitoring devices associated with the CCP processing chamber 101 and the ICP processing chamber 151. For example, the control module 163 can be connected and configured to receive electrical measurement signals, e.g., voltage and/or current, and RF measurement signals from one or more of the wafer support structure 103, the RF feed structure 109, the RF feed structure 117, the RF feed structure 161, the electrical connection 127, and from any other structure or component within the CCP processing chamber 101 and the ICP processing chamber 151. And, the control module 163 can be connected and configured to receive temperature and pressure measurement signals from within the plasma processing regions 102 and 152 of the CCP processing chamber 101 and the ICP processing chamber 151, respectively. Also, the control module 163 can be configured and connected to receive, process, and respond to an optically measured signal within the CCP processing chamber 101 and the ICP processing chamber 151.

It should be understood that the control module 163 can be connected and configured to control essentially any active device, i.e., controllable device, associated with operation of the CCP processing chamber 101 and the ICP processing chamber 151. And, it should be understood that the control module 163 can be connected and configured to monitor essentially any physical and/or electrical state, condition, and/or parameter at essentially any location within the CCP processing chamber 101 and the ICP processing chamber 151. The control module 163 can also be configured to direct operation of various components in a synchronous and scheduled manner to perform a prescribed plasma processing operation on the wafer 105. For example, the control module 163 can be configured to operate the CCP processing chamber 101 and the ICP processing chamber 151 by executing process input and control instructions/programs. The process input and control instructions/programs may include process recipes having time-dependent directions for parameters such as power levels, timing parameters, process gases, mechanical movement of the wafer 105, etc., as needed to obtain a desired process result on the wafer 105.

In various wafer 105 fabrication processes, such as plasma-based fabrication processes, there are one or more process control parameter(s) that have a controlling effect on one or more fabrication target parameters. For example, in a plasma etch fabrication process, the temperature of the wafer 105 can have a controlling effect on the critical dimension (CD) of a feature formed on the wafer 105. Therefore, in this example, if a parametric relationship between the CD of the feature formed on the wafer 105 and the temperature of the wafer 105 is known, and if the CD of the feature on the wafer is measured, it is possible to determine a wafer 105 temperature adjustment necessary to drive the CD of the feature on the wafer 105 to a target value. Also, in some embodiments, the temperature control of the wafer 105 is a two-dimensional (2D) spatially varying function, such as with the heater assembly 125 that implements the Hydra® Uniformity System of Lam Research Corporation. For example, in some embodiments, the wafer support structure 103 can include a 2D array of temperature control devices, e.g., a 2D array of heating elements. In these 2D varying temperature control embodiments, each temperature control device will have a dominant temperature control influence over a corresponding portion of the wafer 105 near to the temperature control device, and multiple neighboring temperature control devices will have a combined temperature control influence over some portion of the wafer 105. Therefore, in order to drive the CD of the feature on the wafer 105 near each of the temperature control devices to the target value, it is necessary to know a parametric relationship between the CD of the feature formed on the wafer 105 and the temperature of the wafer 105. And, it is necessary to know how the temperature at a given location on the wafer 105 is related to operation/control of the temperature control devices at and near the given location on the wafer 105.

In an ideal scenario, a statistically significant sampling of CD measurements would be made within a spatial vicinity of each of the temperature control devices in order to determine a reliable parametric relationship between the CD of the feature formed on the wafer 105 and the temperature of the wafer 105 near each of the temperature control devices. However, this would add up to an infeasible number of CD measurements to be made on the wafer 105, given the time and cost of performing CD measurements on the wafer 105. Therefore, it is of interest to determine a way to reduce the number of CD measurements to be made on the wafer 105 while still enabling determination of a reliable parametric relationship between the CD of the feature formed on the wafer 105 and the temperature of the wafer 105 near each of the temperature control devices. Methods and systems are disclosed herein for identifying a reduced number of CD measurement locations across the wafer 105 that inform determination of a reliable parametric relationship between the CD of features formed across the wafer 105 and the temperature of the wafer 105 near each of the temperature control devices, where the reliable parametric relationship is usable to control the temperature control devices to drive the CD of features across the wafer 105 to respective target values. It should be understood that while the methods and systems are described herein with regard to control of the CD of features fabricated across the wafer 105 via control of temperature control devices across the wafer 105, the methods and systems are not so limited. More specifically, in various embodiments, the methods and systems disclosed herein can be extended to the control of essentially any measurable parameter on the wafer (not just CD) as function of position on the wafer, relative to control of essentially any process control parameter (e.g., temperature, pressure, process gas flow rate, bias voltage, RF power, among others) as a function of position on the wafer.

Prior to the methods and systems disclosed herein, on-wafer metrology sampling locations (i.e., on-wafer feature measurement locations) were chosen based on a number of criteria including, but not limited to, metrology machine bandwidth, uniformity of metrology sampling locations across the surface of the wafer 105, and placement of more metrology sampling locations at/near the edge of the wafer 105 due to higher die count as a function of radial position (i.e., higher die density) near the edge of the wafer 105. Prior to the methods and systems disclosed herein, selection of on-wafer metrology sampling locations did not take into account the spatial shape boundedness of process control parameters (i.e., process control knobs) that were available. Also, prior to the methods and systems disclosed herein, selection of on-wafer metrology sampling locations ignored the shape of features at dimension scales smaller than the range of influence of utilized process control parameters.

Methods and systems are disclosed herein for measuring spatial frequencies associated with process control parameters to inform an optimal on-wafer feature measurement lattice that encompass feature dimensional changes on a dimensional scale of the process control parameters, i.e., within the range of influence of the process control parameters. The methods and systems disclosed herein also provide for reducing a number of required on-wafer metrology sampling locations by identifying and/or establishing relationships between the on-wafer metrology sampling locations. By reducing the number of required on-wafer metrology sampling locations, the required metrology bandwidth is correspondingly reduced, while maintaining an understanding of the underlying shape(s) of the on-wafer features at dimension scales smaller than the spatial effect (range of influence) of the process control parameters. Additionally, by reducing the number of required on-wafer metrology sampling locations, it is possible to make more informed decisions about which on-wafer metrology sampling locations are to be used as indicators/inputs for process control purposes. For example, consider a region on the wafer 105 that has a skewed distribution of measured feature dimension values. Due to the skew in the distribution of measured feature dimension values, if on-wafer metrology sampling locations are selected within the region to capture (i.e., be indicative of) the mean of the skewed distribution of measured feature dimension values, the selected on-wafer metrology sampling locations may not capture a significant portion of the measured feature dimension values within the region. Therefore, understanding the shape of the skewed distribution of measured feature dimension values within the region enables better selection of on-wafer metrology sampling locations within the region to capture a largest possible number of the measured feature dimension values within the region. In other words, understanding the shape of the skewed distribution of measured feature dimension values within the region enables better selection of on-wafer metrology sampling locations within the region to capture a highest possible cumulative sum (or integration) of the skewed distribution of measured feature dimension values.

Semiconductor manufacturing equipment controls (process control parameters) are wavenumber limited in the sense that the effect of a control action will have a spatially distributed shape relative to the wafer 105. For example, thermal diffusivity of materials tends to spread and blur the temperature distribution arising from heaters disposed within the wafer support structure 103. It is desirable to optimize on-wafer metrology sampling for control of a particular on-wafer feature in semiconductor manufacturing. Methods and systems disclosed herein provide for satisfaction of two objectives: 1) nearly optimal on-wafer metrology sampling given the wavenumber limitation of the controller that controls the process control parameter of interest, and 2) compression of higher spatial frequency data into the aforementioned nearly optimal on-wafer metrology sampling. It should be understood that these two objectives are in competition with each other. Specifically, it is necessary to make enough on-wafer feature dimension measurements in a sufficient spatial manner in order to determine how a particular process control parameter should be controlled/adjusted to drive the feature dimension to a desired target value, such as in accordance with sampling theory. But, in a competing sense, it is necessary to minimize the number of the on-wafer feature dimension measurements due to the time and cost of each measurement. This minimization of the number of the on-wafer feature dimension measurements is referred to as compression, and is done in a methodical manner so that the on-wafer feature dimension measurements that are performed will be representative of the dimensional behavior (with respect to the particular process control parameter) of as many on-wafer features as possible. Generally speaking, compression is intelligently minimizing the set of on-wafer metrology sampling locations (x,y) where CD measurements are to be made while still having the collective CD measurements represent as much of the wafer as possible.

Figure 2:
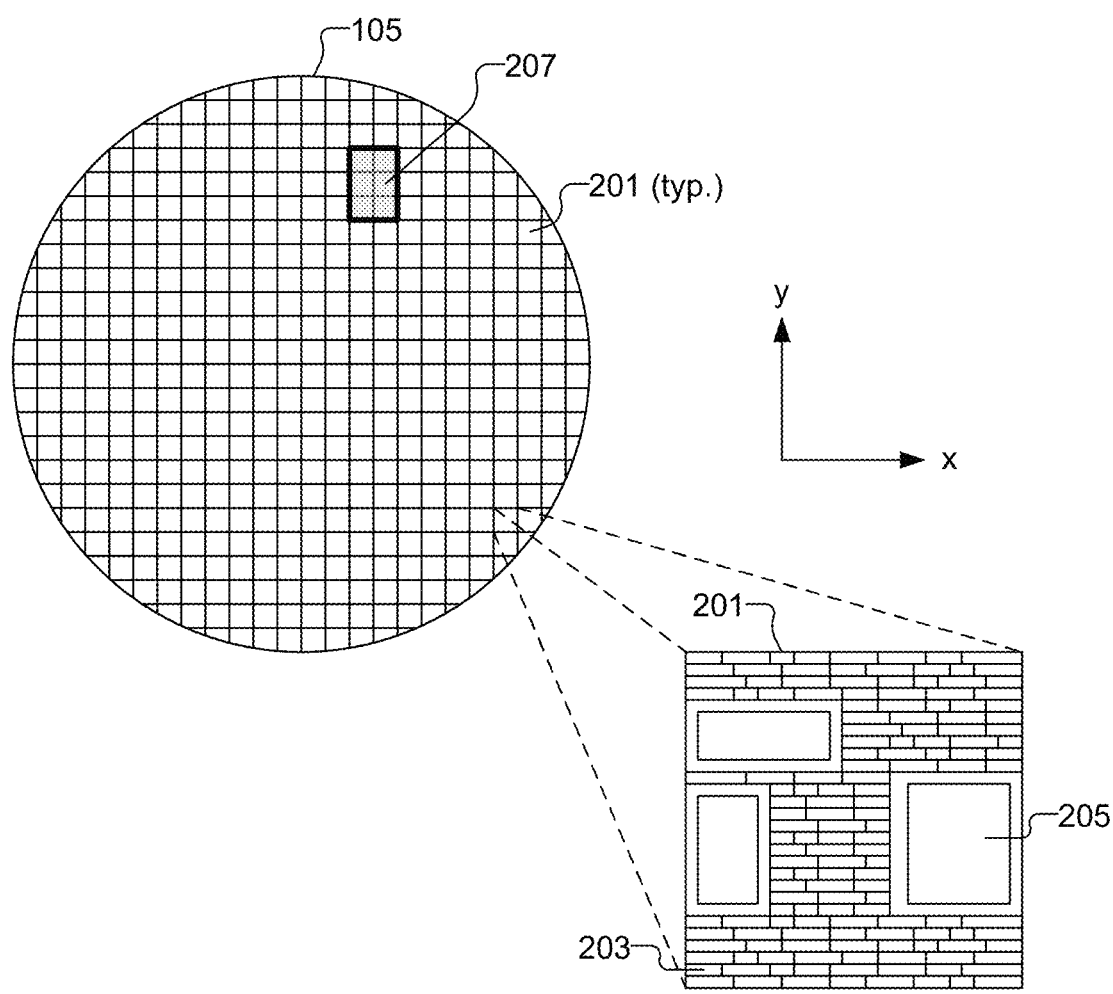
FIG. 2 shows a diagram of an example hierarchical structure on the wafer, in accordance with some embodiments.

The notion of a single on-wafer feature can be understood in terms of semiconductor chips being manufactured on the wafer 105 with hierarchical structure. FIG. 2 shows a diagram of an example hierarchical structure on the wafer 105, in accordance with some embodiments. At a highest level, the hierarchical structure includes a number of die 201 (chips) arranged in a lattice, e.g., square/rectangular lattice, across the wafer 105. At a lower level of the hierarchical structure, a number of cells 203 and blocks 205 are arranged within each die 201. At an even lower level of the hierarchical structure, each cell 203 and/or block 205 includes substructures, such as but not limited to a number of transistors (including diffusion regions, gate electrodes, etc.), contact structures (including diffusion contacts and gate contacts), conductor structures (including local interconnect conductive lines, upper level metallization lines, etc.). The hierarchical level of primary interest is the die 201 comprised of many substructures. The substructures of the die 201 are made up of features. Some examples of features include, but are not limited to, a pitch, a hole diameter, a trench depth, a trench width, a structure dimension, a structure surface angle (relative to the substrate of the wafer 105), among others. Often, a lithographic process will print many die per lithographic exposure for throughput enhancement. FIG. 2 shows an example lithographic exposure 207. The lithographic exposure 207 is the imaging field of the lithographic process. The lithographic exposure is the largest repeatable unit of the hierarchical structure and is referred to herein as a field (or lithographic field).

Many of the process control parameters involved in performing a plasma fabrication process on the wafer 105, such as in either the CCP processing chamber 101 or the ICP processing chamber 151, can exert an influence over a spatial area at least as large as the spatial extent of the field. This means that at a highest level of process control spatial precision, one or more of the process control parameters can be controlled to alter process results, e.g., feature shapes, within the spatial extent of an entire field, as opposed to just within the spatial extent of a specific die 201 or lower sub-die hierarchical structure, such as cell 203 or block 205. Therefore, the methods and systems disclosed herein provide for metrology sampling of a single on-wafer feature over a given field, represent a shape of the distribution of the sampled feature value over the given field, and compress the shape of the distribution of the sampled feature value over the given field into one or more representative values for process control purposes.

The method begins with determining a smallest reasonable characteristic length over which metrology-sampled on-wafer feature dimension values can be expected to change. In some embodiments, the characteristic length is determined by lithographic controls and deposition of photoresist. Since a field is rectangular-shaped, the smallest characteristic length may be different in the x-direction (i.e., horizontal direction with the wafer notch at 6 o'clock position) and the y-direction (i.e., vertical direction with the wafer notch at 6 o'clock position). Generally speaking, with the field being rectangular-shaped, the spatial frequency support would then be an ovular shape in the wavenumber space. However, for purposes of simplification, a minimum of the characteristic lengths in the x-direction and the y-direction will inform a maximum circular spatial frequency support of the on-wafer feature dimension value response surface. In following, the maximum circular spatial frequency support of the on-wafer feature dimension value response surface informs an optimal hexagonal sampling lattice. Then, to an extent that the same on-wafer feature can be measured close to the optimal hexagonal sampling lattice, a unit cell of the optimal hexagonal sampling lattice includes a possible on-wafer metrology sampling location, with approximately one possible on-wafer metrology sampling location per unit cell of the optimal hexagonal sampling lattice.

Representation of on-wafer feature dimension values within a field can be done parametrically or statistically. Parametric representation of on-wafer feature dimension values within the field is limited to any functional representation such that the Fourier transform vanishes, or is at least negligible, at wavenumbers larger than the aforementioned feature wavenumber limitation of the controller that controls the process control parameter of interest. Example parametric representations of on-wafer feature dimension values within the field include, but are not limited to, 2D polynomials, wavelets, and radial basis functions.

Statistical representation of on-wafer feature dimension values within the field express the on-wafer feature dimension value at each metrology sampling location in terms relative to a constant, such as the field average, in terms of central statistical moments such as mean, variance, etc. An example of a statistical representation would be the reduction of multiple on-wafer metrology sampling locations within a field to a set of possible representative on-wafer metrology sampling locations based on covariance analysis (so as to reduce the number of on-wafer feature sampling locations to measure). Then, the statistical stability of the measured feature dimension values within the set of possible representative on-wafer sampling locations is assessed with respect to the mean of the measured feature dimension values of the multiple on-wafer metrology sampling locations within the field to inform selection of a representative on-wafer sampling location that has low variance [var(site_value–field_mean)]. The measured feature dimension value of the representative on-wafer sampling location may have a stable offset from the mean of the measured feature dimension values of the multiple on-wafer metrology sampling locations within the field. Representation of an entire field with the smallest number of representative on-wafer metrology sampling locations entails finding metrology sampling locations that have measured feature dimension values that have 1) a low absolute difference from the mean of the measured feature dimension values of multiple on-wafer metrology sampling locations within the field, and 2) a low variance from wafer-to-wafer and field-to-field.

Some prior metrology approaches have simply measured the CD of an on-wafer feature at one location near a center of the field, without considering whether or not the behavior of the CD of the measured on-wafer feature (relative to a process control parameter) is representative other features within the field. Given that cost and time set practical limits on the number of on-wafer feature CD measurements that can be made per field, e.g., about two measurements per field, it is of interest to determine where in the field to make the on-wafer feature CD measurements so that those CD measurement can be used to inform control/adjustment of the process control parameter to achieve the best possible process results across the field as a whole. Each field can include hundreds of thousands of cells. Therefore, determination of optimum on-wafer metrology sampling locations within the field is a compressive task that takes into consideration how CD measurements at different locations with the field relate to each other, so that subsets of correlated CD measurements can be identified, and each subset of correlated CD measurements can be reduced to one representative CD measurement, i.e., to one on-wafer metrology sampling location.

In order to determine the optimum on-wafer metrology sampling locations within the field, it is necessary to establish a set of learning data that can be processed to identify correlations between CD measurements within the field. The set of learning data is essentially a large number of CD measurements made at different on-wafer metrology sampling locations within the field 207 after completion of each of many iterations of a fabrication process on the wafer 105, where each iteration of the fabrication process is performed with the wafer 105 having a substantially similar initial condition (pre-process condition), and where each iteration of the fabrication process utilizes a different setting of a process control parameter that is to be controlled/adjusted to drive the CD (corresponding to the CD measurements) to a target value. An example set of learning data may include CD measurements of a selected on-wafer feature in each of seven cells 203, in each of four blocks 205, in each of five die 201, in each field 207 on the wafer 105. In this example, the set of learning data includes 140 CD measurement per field per iteration of the fabrication process (i.e., per setting of the process control parameter), which is a large number of measurements per iteration, but still represents less than 1% of the cells 203 on the wafer 105.

The method for compression includes identifying cell-to-cell correlations in the set of learning data. For example, positive correlated cells are identified that have respective CD measurement values that change in the same direction as the setting of the process control parameter is changed. Also, negative correlated cells are identified that have respective CD measurement values that change in the opposite direction as the setting of the process control parameter is changed. And, non-correlated cells are identified that have CD measurement values that change in ways that are not consistently relatable to how corresponding CD measurement values change in another cell, as the setting of the process control parameter is changed. The behavior of the CD measurement value for the set of positive correlated cells can be gleaned from any one of the positive correlated cells. Therefore, it is only necessary to have the CD measurement value for any one of the positive correlated cells, i.e., reference cell, in order to determine how the CD measurement value behaves for all of the positive correlated cells, thus reducing the number of CD measurements to be performed. Similarly, the behavior of the CD measurement value for the set of negative correlated cells can be gleaned from any one of the negative correlated cells. Therefore, it is only necessary to have the CD measurement value for any one of the negative correlated cells, i.e., reference cell, in order to determine how the CD measurement value behaves for all of the negative correlated cells, thus reducing the number of CD measurements to be performed. Also, some cells can have both positive and negative correlations with one or more other cells, thereby further reducing the number of CD measurements to be performed.

In the above-mentioned example in which the set of learning data included 140 CD measurements per field, it was determined that 36 cells per field were reference cells that collectively represent the CD measurement value behavior of all 140 cells in the set of learning data. Therefore, the compression at this point provides for CD measurement at 36 on-wafer metrology locations per field to understand the CD behavior at 140 on-wafer metrology locations per field. However, performing CD measurements at even 36 on-wafer metrology locations per field is cost and time prohibitive. Therefore, further compression is undertaken to determine whether or not a subset of the CD measurement values at the 36 reference cells can be used to represent the CD measurement value behavior (as a function of the process control parameter) at the 36 reference cells as a whole.

The CD measurement values of the 36 reference cells can be analyzed as a reference data set. Therefore, the mean, median, variance, standard deviation, and other statistical parameters, can be computed for the reference data set. Also, the reference data set can be represented as a distribution. In some embodiments, a determination is made as to whether or not any of the 36 reference cells has a reliable shape relative to a center of the distribution of the reference data set, from field-to-field and/or wafer-to-wafer, where the center of the distribution of the reference data set can be represented by either the mean or the median of the distribution of the reference data set. Also, the reliable shape means that the shape is consistent relative to the center of the distribution of the reference data set. Therefore, the subject of investigation is whether or not there is any cell in the set of 36 reference cells that behaves consistently relative to the mean or median of the distribution of the reference data set within a given wafer. In some embodiments, a difference between the CD measurement value of each of the reference cells and the mean or median of the distribution of the reference data set is computed, over all field and all wafers. This generates a separate distribution of distance-to-the-mean/median of the distribution of the reference data set for each of the reference cells. In some embodiments, the reference cell that has the lowest variance in distance-to-the-mean/median of the distribution of the reference data set is selected to represent the set of reference cells. The variance in these embodiments is calculated as the root-mean-square-error (RMSE).

In various embodiments, the compression methods discussed herein can provide for selection of a limited number of on-wafer metrology sampling locations per field that represent the field as a whole with regard to CD response to a particular process control parameter. In various embodiments, the limited number of on-wafer metrology sampling locations per field generated by the compression techniques disclosed herein can be one, two, or three. However, it should be understood that in some embodiments, the limited number of on-wafer metrology sampling locations per field generated by the compression techniques disclosed herein can exceed more than three, if feasible considering the cost and time associated with the metrology measurements.

Once the reference cell(s) are selected for the field, the CD measurement(s) of the on-wafer feature within the selected reference cell(s) are correlated to the process control parameter that was controlled/adjusted during development of the set of learning data. Equation 1 shows an example correlation function that defines how the CD measurement(s) of the on-wafer feature within the reference cell(s) are correlated to the process control parameter that was controlled/adjusted during development of the set of learning data.

$$\Delta CD(x,y) = S_P \cdot \Delta P(x,y) \quad \text{Equation 1.}$$

In Equation 1, $\Delta CD(x,y)$ is the change in measured CD value of the on-wafer feature at the metrology sampling location $(x,y)$, $\Delta P(x,y)$ is the change in value of the process control parameter (P) at the metrology sampling location $(x,y)$, and $S_P$ is a coefficient representing a sensitivity of the change in measured CD value of the on-wafer feature at the metrology sampling location $(x,y)$ to the change in value of the process control parameter (P) at the metrology sampling location $(x,y)$. For example, if the process control parameter of interest is temperature, Equation 1 can be rewritten as shown in Equation 2, where (T) is temperature.

$$\Delta CD(x,y) = S_T \cdot \Delta T(x,y) \quad \text{Equation 2.}$$

Also, while Equations 1 and 2 use Cartesian coordinates $(x,y)$ to define the spatial location on the wafer, where the $(x)$ and $(y)$ distances are measured relative to an origin of the Cartesian coordinate system, it equally acceptable to use polar coordinates $(r,\theta)$ to define the spatial location on the wafer, where $(r)$ is a radius measured from an origin of the polar coordinate system and $(\theta)$ is an angle measured from a reference vector extending through the origin of the polar coordinate system. The measured CD values of the on-wafer feature within the selected reference cell(s) in the set of learning data are used to compute the sensitivity coefficient $S_P$. As more wafers are fabricated, additional CD measurements of the on-wafer feature within the selected reference cell(s) can be made and added to the set of learning data, and the sensitivity coefficient $S_P$ can be updated based on the expanded set of learning data. Once established, the correlation function of Equation 1 can be used to determine how to adjust the process control parameter (P) at a given location $(x,y)$ or $(r,\theta)$ on the wafer to obtain a desired $\Delta CD$ for the on-wafer feature in the selected reference cell(s) at the given location $(x,y)$ or $(r,\theta)$ on the wafer $(x,y)$. The desired $\Delta CD$ for the on-wafer feature in the selected reference cell(s) at the given location $(x,y)$ or $(r,\theta)$ on the wafer $(x,y)$ can be set to drive the CD of the on-wafer feature in the selected reference cell(s) at the given location $(x,y)$ or $(r,\theta)$ on the wafer $(x,y)$ from a extant measured value to a desired target value. It should be understood that correlation function of Equation 1 is provided by way of example, and that in other embodiments alternative parametric or statistical formulations can be used to define how the CD measurement(s) of the on-wafer feature within the reference cell(s) are correlated to the process control parameter that was controlled/adjusted during development of the set of learning data.

An advantage of the methods and systems disclosed herein is that they provide a closed form solution for an optimal on-wafer feature metrology sampling measurement location lattice with respect to the spatial frequency of a process control parameter under consideration. Given the likelihood of a mismatch between the wafer hierarchical structure and the optimal on-wafer feature metrology sampling measurement location lattice, the methods and systems provide for collapsing the field on-wafer feature values into a subset of measurement locations that are representative of the field as a whole. This provides flexibility to align the selected measurement locations with the optimal on-wafer feature metrology sampling measurement location lattice without sacrificing knowledge of the field shape.

Figure 3:
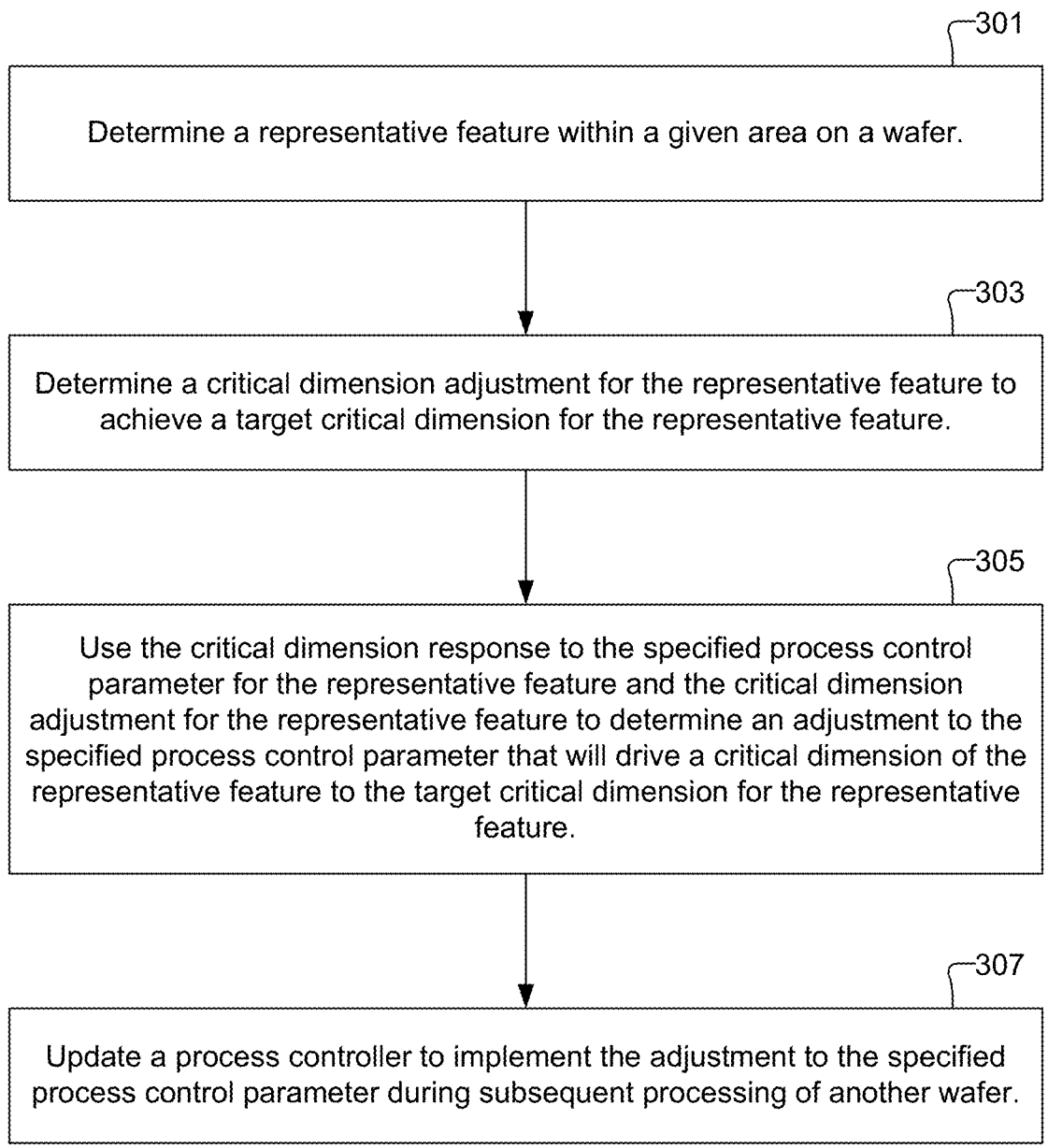
FIG. 3 shows a flowchart of a method for controlling a semiconductor fabrication process, in accordance with some embodiments.

FIG. 3 shows a flowchart of a method for controlling a semiconductor fabrication process, in accordance with some embodiments. The method includes an operation 301 for determining a representative feature within a given area on a wafer. The representative feature has a critical dimension response to a specified process control parameter that is correlated to a critical dimension response to the specified process control parameter of other features within the given area on the wafer. In other words, an observed critical dimension response of the representative feature to the specified process control parameter is correlated to the critical dimension response of other features to the specified process control parameter. In this manner, the critical dimension response to the specified process control parameter of the other features within the given area on the wafer can be determined from the critical dimension response to the specified process control parameter of the representative feature within the given area on the wafer, without having to measure the critical dimension response of the other features within the given area on the wafer. In various embodiments, the representative feature is either a structure, a combination of structures, a trench, a hole, or a spacing between structures within the given area on the wafer. In some embodiments, the representative feature within the given area on the wafer is determined by performing a covariance analysis on critical dimension responses to the specified process control parameter for the representative feature and the other features within the given area on the wafer. In some embodiments, the given area on the wafer corresponds to a smallest area on the wafer in which process control effects can be distinguished. In some embodiments, the given area on the wafer corresponds to a field of lithographic exposure during fabrication of the wafer.

In some embodiments, a location of the representative feature on the wafer corresponds to a unit cell of a sampling lattice, where the sampling lattice is based on a spatial frequency of the specified process control parameter. The spatial frequency of the specified process control parameter is based on a spatial arrangement of devices used to control the specified process control parameter. For example, if the specified process control parameter is wafer temperature, the specified process control parameter (wafer temperature) can be based on a spatial arrangement of temperature control devices relative to the wafer, e.g., can be based on a spatial arrangement of heaters within the wafer support structure 103. In some embodiments, the unit cell of the sampling lattice is sized to a smallest characteristic length over which metrology-sampled on-wafer feature dimension values are expected to change. In some embodiments, the smallest characteristic length is measured in either an x-direction or a y-direction on the wafer. In some embodiments, the sampling lattice is a hexagonal lattice, and the unit cell of the sampling lattice is sized to tangentially contact a circle having a diameter equal to the smallest characteristic length.

In some embodiments, the method can include an operation for determining the critical dimension response to the specified process control parameter for the representative feature and for the other features within the given area on the wafer by performing a design of experiments on multiple wafers to establish the above-mentioned set of leaning data. The design of experiments can include performing a same fabrication process on each of the multiple wafers using a different setting of the specified process control parameter for each of the multiple wafers, and measuring the critical dimensions of the representative feature and of the other features within the given area on the wafer on each of the multiple wafers.

The method also includes an operation 303 for determining a critical dimension adjustment for the representative feature to achieve a target critical dimension for the representative feature. The critical dimension adjustment for the representative feature is an amount of change in the critical dimension for the representative feature necessary to move a current expected value of the critical dimension for the representative feature to a target value of the critical dimension for the representative feature. In some embodiments, the current expected value of the critical dimension for the representative feature is determined by measuring the critical dimension for the representative feature on a wafer that has been processed to form the representative feature. In some embodiments, the current expected value of the critical dimension for the representative feature is determined by deriving the critical dimension for the representative feature on the wafer from a known critical dimension of another feature on the wafer. In some embodiments, determining the critical dimension adjustment for the representative feature in operation 303 includes measuring the critical dimension of the representative feature on the wafer, and determining a difference between the measured value of the critical dimension of the representative feature and a target value for the critical dimension of the representative feature. In these embodiments, the measurement of the critical dimension of the representative feature is made after completing a fabrication process on the wafer to form the representative feature. In some embodiments, operation 303 includes obtaining the critical dimension adjustment for the representative feature from a secondary source, such as from a database, a look-up-table, an operator input, etc.

The method continues with an operation 305 for using the critical dimension response to the specified process control parameter for the representative feature and the critical dimension adjustment for the representative feature to determine an adjustment to the specified process control parameter that will drive a critical dimension of the representative feature to the target critical dimension for the representative feature. In some embodiments, determining the adjustment to the specified process control parameter in operation 305 includes dividing the critical dimension adjustment for the representative feature by a sensitivity factor, where the sensitivity factor represents a sensitivity of the critical dimension of the representative feature to the specified process control parameter. In various embodiments, the specified process control parameter is one or more of a temperature, a pressure, a process gas flow rate, a bias voltage, and a radiofrequency power, among others. In some embodiments, the specified process control parameter varies in two dimensions across the wafer.

The method also includes an operation 307 for updating a process controller to implement the adjustment to the specified process control parameter during subsequent processing of another wafer. In this manner, it can be expected that on the other wafer the critical dimension of the representative feature (after completion of fabrication) will move closer toward the target value of the critical dimension for the representative feature. In some embodiments, the process controller is configured to control power delivery to each of multiple heating components distributed across a wafer support structure. And, in these embodiments, the operation 307 can include updating the process controller to implement adjustments to power delivered to one or more of the multiple heating components during fabrication of the representative feature on the other wafer. In some embodiments, the operation 307 for updating the process controller includes accessing data that defines response values of the specified process control parameter as a function of position relative to the wafer for different process input control settings that drive the specified process control parameter.

Conventionally, a hypothesis-test method has been used to investigate which input metrology variables and process control parameters (control knobs) are useful to estimate post-processing variables of interest. In this hypothesis-test method, a process engineer (who is an expert in a given wafer fabrication process) is required to formulate a hypothesis about which input metrology variables and process control parameters are useful to estimate post-processing variables of interest. Then, a control strategy based on the hypothesis is formulated and tested. This hypothesis-test method does not natively account for pre-processing characteristic correlation, because the process engineer may not be aware of the intricacies of the optical critical dimension (OCD) geometry model. Also, the hypothesis-test method is often limited in the number of pre-processing variables considered due to human limitations and tends to result in simple, linear models being used where, physically, interactions and nonlinear behavior may be expected.

OCD metrology via spectral reflectometry and an associated geometric/materials model is widely used in the semiconductor industry to characterize film thicknesses and feature geometries. This type of OCD metrology can be performed both before performing a fabrication process on the wafer (pre-process metrology) and after performing the fabrication process on the wafer (post-process metrology). By way of example, plasma-based etching is a fabrication process performed on the wafer where pre-process metrology and post-process metrology can be acquired and analyzed. OCD metrology is essentially a measurement of a geometric parameter on the wafer, such a thickness of a material layer, a size of an opening, an angle of a surface, a distance between structures, a size of a structure, etc.

Figure 4A:
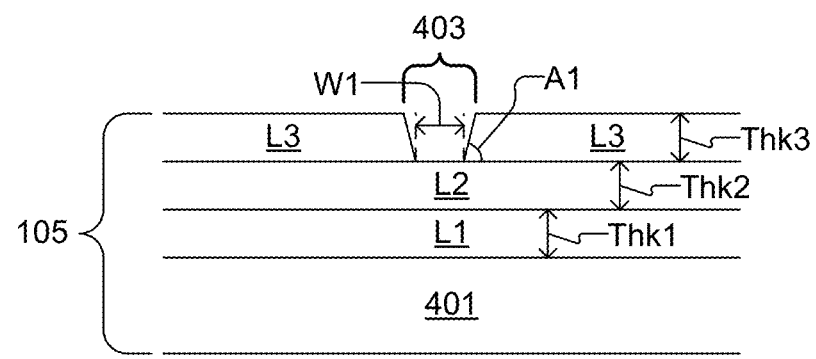
FIG. 4A shows an example of pre-process metrology that can be measured for an example wafer configuration using OCD metrology, in accordance with some embodiments.
Figure 4B:
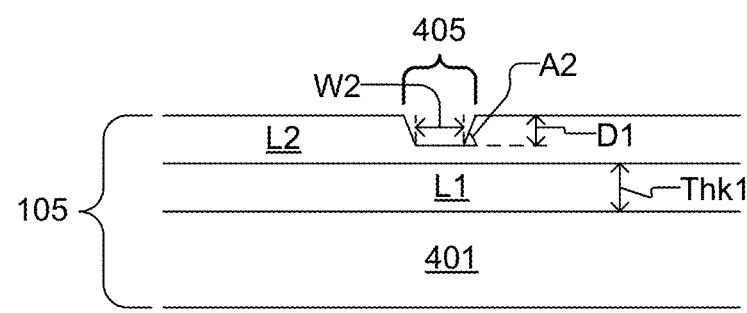
FIG. 4B shows an example of post-process metrology that can be measured for the example wafer configuration of FIG. 4A using OCD metrology, in accordance with some embodiments.

FIG. 4A shows an example of pre-process metrology that can be measured for an example wafer configuration using OCD metrology, in accordance with some embodiments. And, FIG. 4B shows an example of post-process metrology that can be measured for the example wafer configuration of FIG. 4A using OCD metrology, in accordance with some embodiments. FIG. 4A shows the example wafer configuration including a number of material layers L1, L2, L3 formed on a substrate 401 of the wafer 105. An opening 403 is formed in the material layer L3. For example, the material layer L3 can be a photoresist material having the opening 403 formed in preparation for performance of a plasma-based etching process on the wafer 105. An example set of pre-process metrology for the wafer configuration of FIG. 4A can include a width (W1) of the opening 403, a wall angle (A1) of the opening 403, and respective thicknesses Thk1, Thk2, Thk3 of the material layers L1, L2, L3. The post-process configuration of the wafer 105 as shown in FIG. 4B has material layer L3 removed, and has a trench 405 formed in the material layer L2. An example set of post-process metrology for the wafer configuration of FIG. 4B can include a width (W2) of the trench 405, a wall angle (A2) of the trench 405, and a depth (D1) of the trench 405. It should be understood that the wafer configurations of FIGS. 4A and 4B are arbitrarily chosen to facilitate description and do not in any way limit the methods and systems disclosed herein.

The set of pre-process metrology parameters can be represented as $\{\phi_1, \ldots, \phi_{n\_preOCD}\}$, where $\phi_j$ is a function of spatial location (x,y) or (r,θ) on the wafer, and where n_preOCD is the number of pre-process metrology parameters. For example, with regard to FIG. 4A, the set of pre-process metrology parameters can be represented as $\phi_1(x,y)=W1(x,y)$; $\phi_2(x,y)=A1(x,y)$; $\phi_3(x,y)=Thk1(x,y)$; $\phi_4(x,y)=Thk2(x,y)$; and $\phi_5(x,y)=Thk3(x,y)$, wherein n_preOCD=5. The set of post-process metrology parameters can be represented as $\{\gamma_1, \ldots, \gamma_{n\_postOCD}\}$, where $\gamma_k$ is a function of spatial location (x,y) or (r,θ) on the wafer, and where n_postOCD is the number of post-process metrology parameters. For example, with regard to FIG. 4B, the set of post-process metrology parameters can be represented as $\gamma_1(x,y)=W2(x,y)$; $\gamma_2(x,y)=A2(x,y)$; and $\gamma_3(x,y)=D1(x,y)$, wherein n_postOCD=3. Also, a set of process control parameters can be represented as $\{\rho_1, \ldots, \rho_{n\_cp}\}$, where $\rho_j$ is a function of spatial location (x,y) or (r,θ) on the wafer, and where n_cp is the number of process control parameters under consideration for affecting control of a given one of the post-process metrology parameters. For example, temperature of the wafer as a function of spatial location (x,y) or (r,θ) on the wafer can be can be a process control parameter ($\rho_1$).

A method is disclosed herein for determining which of the pre-process metrology parameters $\{\phi_1, \ldots, \phi_{n\_preOCD}\}$ and process control parameters $\{\rho_1, \ldots, \rho_{n\_cp}\}$ are useful (relevant) for estimating a given one of the post-process metrology parameters $\{\gamma_1, \ldots, \gamma_{n\_postOCD}\}$ of interest. The determined set of useful pre-process metrology parameters $\{\phi_1, \ldots, \phi_{n\_preOCD}\}$ and process control parameters $\{\rho_1, \ldots, \rho_{n\_cp}\}$ can be represented as $\{\psi_1, \ldots, \psi_{n\_ip}\}$, where $\psi_k$ is a function of spatial location (x,y) or (r,θ) on the wafer, and where n_ip is the number of useful pre-process metrology parameters $\{\phi_1, \ldots, \phi_{n\_preOCD}\}$ and process control parameters $\{\rho_1, \ldots, \rho_{n\_cp}\}$. And, after determining which pre-process metrology parameter(s) and process control parameter(s) are useful for estimating the given post-process metrology parameter of interest, i.e., after determining $\{\psi_1, \ldots, \psi_{n\_ip}\}$, an input+control model is determined for use in optimizing control of the useful process control parameter(s) in view of measurements of the useful pre-process metrology parameter(s) to drive a desired output for the given one of the post-process metrology parameters. The input+control model can be used to optimize control of process control parameter(s) in view of a set of measured values for certain pre-process metrology parameters so as to drive a post-process metrology parameter to a target value.

In some embodiments, the input+control model can be defined as a linear combination of basis functions. In these embodiments, the method includes creation of a set of basis functions $\{q_1(x,y), \ldots, q_n(x,y)\}$ from the set $\{\psi_1, \ldots, \psi_{n\_ip}\}$ of useful pre-process metrology parameters $\{\phi_1, \ldots, \phi_{n\_preOCD}\}$ and process control parameters $\{\rho_1, \ldots, \rho_{n\_cp}\}$. Each basis function $q_j(x,y)$ is an element of a particular basis for a function space, such that each continuous function in the function space can be represented by a linear combination of the basis functions $\{q_1(x,y), \ldots, q_n(x,y)\}$. The basis functions $\{q_1(x,y), \ldots, q_n(x,y)\}$ can also be referred to as blending functions because a combination of the basis functions $\{q_1(x,y), \ldots, q_n(x,y)\}$ provides an interpolation function. The basis functions $\{q_1(x,y), \ldots, q_n(x,y)\}$ can have any functional form, i.e., can be linear functions or non-linear functions. The method also includes selecting a most efficient set of the basis functions $\{q_1(x,y), \ldots, q_n(x,y)\}$ for estimating values of the post-process metrology parameter(s) of interest.

When the input+control model is defined as a linear combination of the basis functions $\{q_1(x,y), \ldots, q_n(x,y)\}$, the post-process metrology parameter of interest is equal to a sum over the number of useful parameters (n_ip) of a product of the basis function $q_j(x,y)$ for each useful parameter (j) and a corresponding sensitivity coefficient, plus a constant offset parameter, where the useful parameters include at least one process control parameter $\{\rho_1, \ldots, \rho_{n\_cp}\}$ and at least one pre-process metrology parameter $\{\phi_1, \ldots, \phi_{n\_preOCD}\}$. This form of input-model is shown in Equation 3.

$$d_{BG}(x,y) = \Sigma_{n=1}^{nip} S_n(x,y) \cdot q_n(x,y) + b(x,y) \quad \text{Equation 3.}$$

In Equation 3, $d_{BG}(x,y)$ is the post-process metrology parameter of interest, i.e., the post-process metrology parameter that is to be driven to a target value, as a function of location on the wafer. The term $S_n(x,y)$ is the sensitivity coefficient for the basis function $q_n(x,y)$. The sensitivity coefficient $S_n(x,y)$ represents the sensitivity of the post-process metrology parameter of interest $d_{BG}(x,y)$ to a change in value of the useful parameter (n) corresponding to the basis function $q_n(x,y)$. The term $b(x,y)$ is the constant offset parameter.

In some embodiments, the input+control model can be defined as a differential model, such as shown in Equation 4. In Equation 4, the term $d_{BSL}(x,y)$ is a baseline value of the post-process metrology parameter of interest, and the term $q_{n,bsl}(x,y)$ is the baseline value of the basis function $q_n(x,y)$, and the term $\Delta d_{BG}(x,y)$ is the change in value of post-process parameter of interest relative to the baseline for a given set of value changes of the useful parameters (n).

$$\Delta d_{BG}(x,y) = d_{BG}(x,y) - d_{BSL}(x,y) = [\Sigma_{n=1}^{nip} S_n(x,y) \cdot (q_n(x,y) - q_{n,bsl}(x,y))] + b(x,y) \quad \text{Equation 4.}$$

In some embodiments, the input+control model of Equation 4 can be expanded to include parametric interactions, such as shown in Equation 5. In Equation 5, the term $S_{n|m}(x,y)$ is the sensitivity coefficient for the interaction between the basis functions $q_{n|m}(x,y)$ and $q_{n|m,bsl}(x,y)$. The sensitivity coefficient $S_{n|m}(x,y)$ represents the sensitivity of the post-process metrology parameter of interest $d_{BG}(x,y)$ to a change in value of the useful parameter (n) corresponding to the basis function $q_n(x,y)$ in conjunction with a change in value of the useful parameter (m) corresponding to the basis function $q_{n|m}(x,y)$.

$$\Delta d_{BG}(x,y) = d_{BG}(x,y) - d_{BSL}(x,y) = [\Sigma_{n=1}^{nip} S_n(x,y) \cdot (q_n(x,y) - q_{n,bsl}(x,y))] + [\Sigma_{n=1}^{nip-1} \Sigma_{m=n+1}^{nip} S_{n|m}(x,y) \cdot (q_{n|m}(x,y) - q_{n|m,bsl}(x,y))] + b(x,y) \quad \text{Equation 5.}$$

Determination of the best basis functions to use for estimation of outputs is referred to as feature selection and can be reductive or additive. The basis function pool can be reduced by feature reduction on the pre-process metrology parameters $\{\phi_1, \ldots, \phi_{n\_preOCD}\}$ and/or the process control parameters $\{\rho_1, \ldots, \rho_{n\_cp}\}$. Since many of the pre-process metrology parameter $\{\phi_1, \ldots, \phi_{n\_preOCD}\}$ measurements are correlated due to the geometric model used in the OCD model, the correlated pre-process metrology parameters can be reduced to a single one of the correlated pre-process metrology parameters so as to reduce the number of useful pre-process metrology parameters for the input+control model. The same reductive technique can be applied to the post-process metrology parameters $\{\gamma_1, \ldots, \gamma_{n\_postOCD}\}$ if an input+control model is desired for each post-process metrology parameter $\{\gamma_1, \ldots, \gamma_{n\_postOCD}\}$. Such reductive techniques include, but are not limited to, principal component analysis. Reductive methods can include but are not limited to regularized regression techniques such as Least Absolute Shrinkage and Selection Operator (LASSO) and/or ridge regression.

Also, additive methods for determining which of the basis functions $\{q_1(x,y), \ldots, q_n(x,y)\}$ should be included within the input+control model can include exhaustive algorithms or heuristic algorithms. An example of an additive method that uses an exhaustive algorithm is to iteratively increase the number (n) of basis functions $q_n(x,y)$ allowed in the input+control model and test all combinations of basis functions $\{q_1(x,y), \ldots, q_n(x,y)\}$. For example, consider that there are (N) total basis functions $\{q_1(x,y), \ldots, q_N(x,y)\}$, and (K) basis functions are allowed in the input+control model. In this example, initially, only K=1 basis function, i.e., $q_1(x,y)$, is allowed in the input+control model, resulting in (N) linear input+control models and associated errors, e.g., RMSE. At each iteration of the additive method, (K) is incremented by one and all $$\binom{N}{K},$$

i.e., [N choose K], combinations of input+control linear models and associated errors are estimated. In some embodiments, the additive method can proceed until (K) is equal to (N). In some embodiments, a stopping criteria to cease incrementing (K) can be employed and can be either based on data limitations (not enough data to continue estimating model coefficients) or Akaike Information Criterion (AIC) or some other type of statistical model evaluation criteria such as Bayesian Information Criterion (BIC), among others. AIC can be used on selected input+control models (assuming only input+control models that incorporate basis functions utilizing a process control parameter) at each increment of (K) to determine if the additional complexity arising from more basis functions in the input+control model is warranted. The value of (K) and the associated input+control model that minimizes AIC can be selected as the best input+control model for determining how to control the process control parameter during the wafer fabrication process.

An example of an additive method that uses a heuristic algorithm is to determine the single basis function $q_j(x,y)$ that minimizes the linear modeling error. Then, all (N−1) basis functions (i.e., the set of basis functions $\{q_1(x,y), \ldots, q_n(x,y)\}$ excluding the single basis function $q_j(x,y)$) are used to estimate the linear modeling errors, and the best pair of basis functions based on error estimation is selected to move to the next round of consideration for use in the input+control model. This process is iterated, similarly to the exhaustive algorithm of incrementing (K), by estimating the remaining (N−K) basis function K-tuples until AIC has been minimized or the amount of available data does not support additional coefficients in the input+control model.

It should be understood that the methods disclosed herein for developing the input+control model allow for use of arbitrary basis functions $\{q_1(x,y), \ldots q_n(x,y)\}$ created from the pre-process metrology parameters $\{\phi_1, \ldots, \phi_{n\_preOCD}\}$ and process control parameters $\{\rho_1, \ldots, \rho_{n\_cp}\}$. Also, the methods disclosed herein for developing the input+control model allow for automated discovery of useful (relevant) pre-process metrology parameters $\{\phi_1, \ldots, \phi_{n\_preOCD}\}$ and process control parameters $\{\rho_1, \ldots, \rho_{n\_cp}\}$. Also, the methods disclosed herein for developing the input+control model allow for automated recipe formulation of a design of experiments over a selected set of process control parameters $\{\rho_1, \ldots, \rho_{n\_cp}\}$ to populate the data required for the input+control model estimation. Also, the input+control model disclosed herein allows for automatic optimization of a process control parameter setting (i.e., value) by minimizing, over the process control parameter values, an objective function built from the input+control model estimate and a target value. This results in a process control formulation that is highly automatable and requires a minimum of process engineer expert input. It should be understood that the input+control model development methods disclosed herein provide an automatic way to reduce the number of on-wafer characteristics (pre-process metrology parameters $\{\phi_1, \ldots, \phi_{n\_preOCD}\}$) to test from the OCD model, expands the type and number of basis functions $\{q_1(x,y), \ldots q_n(x,y)\}$ that can be tested, automatically finds useful (relevant) pre-process metrology parameters $\{q_1(x,y), \ldots q_{n\_preOCD}\}$ and process control parameters $\{\rho_1, \ldots, \rho_{n\_cp}\}$ (control knobs), and provides a framework for automatically running DOE processing jobs to supply the required data for development of the input+control model.

Figure 5:
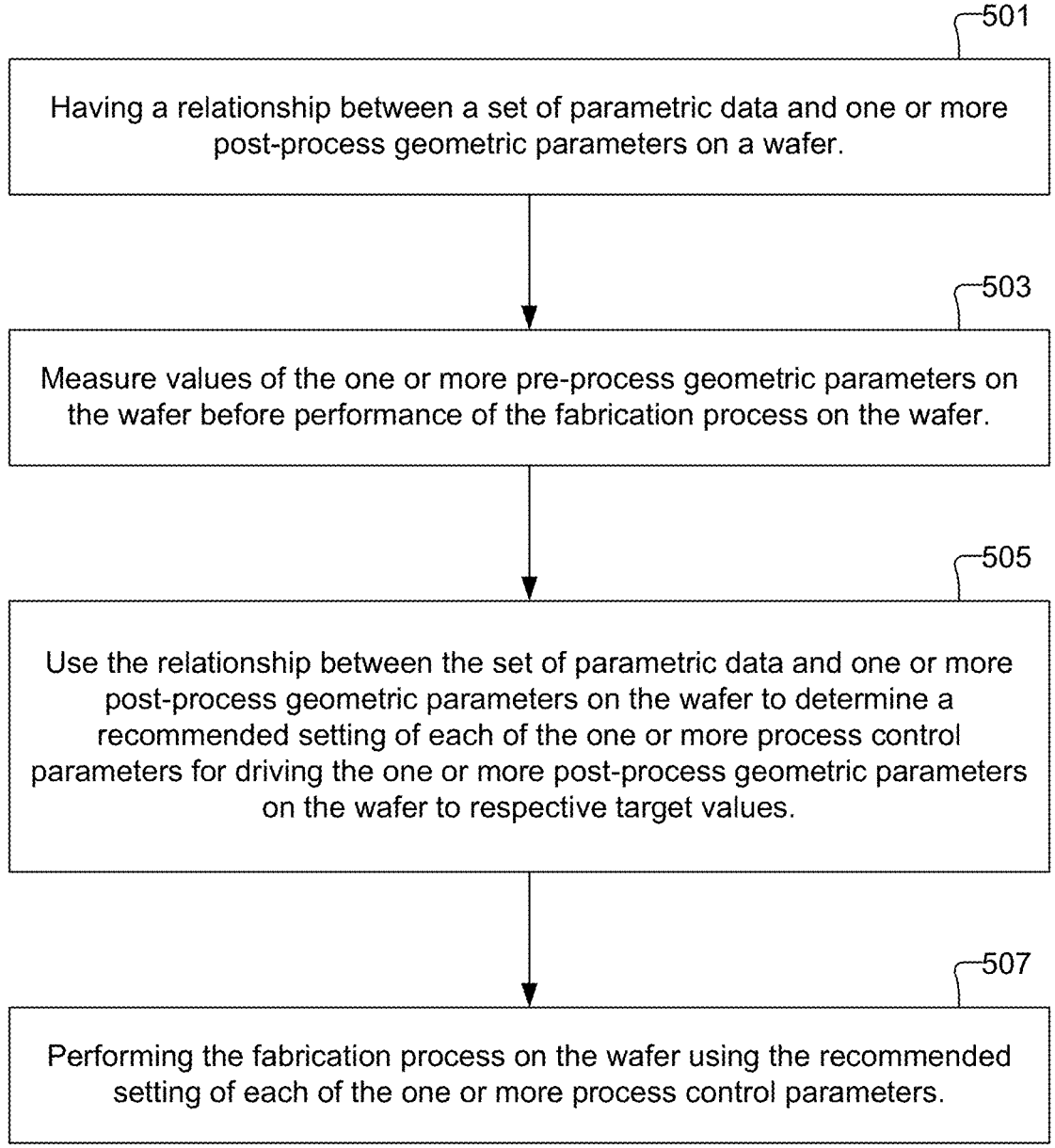
FIG. 5 shows a flowchart of a method for controlling a semiconductor fabrication process, in accordance with some embodiments.

FIG. 5 shows a flowchart of a method for controlling a semiconductor fabrication process, in accordance with some embodiments. The method includes an operation 501 for having a relationship between a set of parametric data and one or more post-process geometric parameters $\{\gamma_1, \ldots, \gamma_{n\_postOCD}\}$ on a wafer. The post-process geometric parameters $\{\gamma_1, \ldots, \gamma_{n\_postOCD}\}$ exist on the wafer after performance of a fabrication process on the wafer. The set of parametric data includes one or more pre-process geometric parameters $\{\phi_1, \ldots, \phi_{n\_preOCD}\}$ on the wafer. The pre-process geometric parameters $\{\phi_1, \ldots, \phi_{n\_preOCD}\}$ exist on the wafer before performance of the fabrication process on the wafer. The set of parametric data also includes one or more process control parameters $\{\rho_1, \ldots, \rho_{n\_cp}\}$ controlled during performance of the fabrication process on the wafer.

In some embodiments, the relationship between the set of parametric data and the one or more post-process geometric parameters $\{\gamma_1, \ldots, \gamma_{n\_postOCD}\}$ on the wafer is a mathematical model (input+control model) that estimates the one or more post-process geometric parameters $\{\gamma_1, \ldots, \gamma_{n\_postOCD}\}$ on the wafer as a weighted combination of basis functions $\{q_1(x,y), \ldots q_n(x,y)\}$, where each of the basis functions is a function of one or more parameters within the set of parametric data. In some embodiments, the one or more pre-process geometric parameters $\{\phi_1, \ldots, \phi_{n\_preOCD}\}$ on the wafer includes one or more of a dimension of a structure on the wafer, a dimension of hole formed on the wafer, a dimension of a trench formed on the wafer, a thickness of a material layer on the wafer, and an angle of a surface on the wafer relative to a reference direction, among others. In some embodiments, the one or more post-process geometric parameters $\{\gamma_1, \ldots, \gamma_{n\_postOCD}\}$ on the wafer includes one or more of a dimension of a structure on the wafer, a dimension of hole formed on the wafer, a dimension of a trench formed on the wafer, a thickness of a material layer on the wafer, and an angle of a surface on the wafer relative to a reference direction, among others. In some embodiments, the one or more process control parameters $\{\rho_1, \ldots, \rho_{n\_cp}\}$ includes one or more of a temperature, a pressure, a process gas flow rate, a bias voltage, and a radiofrequency power, among others.

The method also includes an operation 503 for measuring values of the one or more pre-process geometric parameters $\{\phi_1, \ldots, \phi_{n\_preOCD}\}$ on the wafer before performance of the fabrication process on the wafer. The method also includes an operation 505 in which the relationship between the set of parametric data and one or more post-process geometric parameters $\{\gamma_1, \ldots, \gamma_{n\_postOCD}\}$ on the wafer is used to determine a recommended setting of each of the one or more process control parameters $\{\rho_1, \ldots, \rho_{n\_cp}\}$ for driving the one or more post-process geometric parameters $\{\gamma_1, \ldots, \gamma_{n\_postOCD}\}$ on the wafer to respective target values. The method also includes an operation 507 for performing the fabrication process on the wafer using the recommended setting of each of the one or more process control parameters $\{\rho_1, \ldots, \rho_{n\_cp}\}$. In some embodiments, at least one of the one or more process control parameters $\{\rho_1, \ldots, \rho_{n\_cp}\}$ is controllable in two-dimensional space across the wafer. In some of these embodiments, the relationship between the set of parametric data and the one or more post-process geometric parameters $\{\gamma_1, \ldots, \gamma_{n\_postOCD}\}$ on the wafer is defined as a function of two-dimensional space across the wafer. And, the recommended setting of each of the one or more process control parameters $\{\rho_1, \ldots, \rho_{n\_cp}\}$ is defined as a function of two-dimensional space across the wafer.

Figure 6:
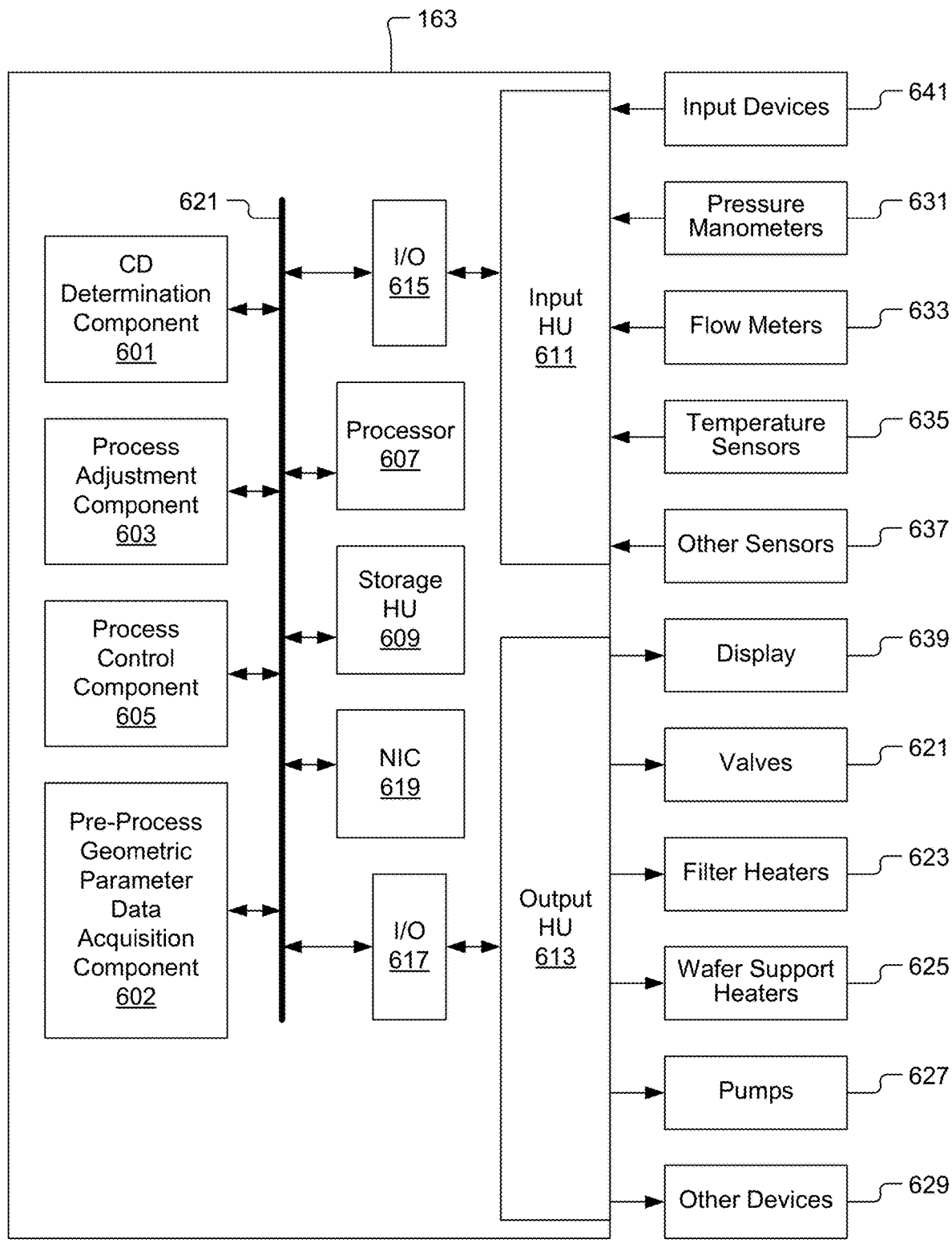
FIG. 6 shows an example schematic of the controller, in accordance with some embodiments.

FIG. 6 shows an example schematic of the controller 163, in accordance with some embodiments. In some embodiments, the controller 163 is configured as a process controller for controlling the semiconductor fabrication process performed in either the CCP processing chamber 101 or the ICP processing chamber 151. The controller 163 includes a critical dimension determination component 601, a process adjustment component 603, and process control component 605. The critical dimension determination component 601 is configured to direct measurement of a critical dimension of a representative feature within a given area, such as within a lithographic field, on a first wafer after completion of a fabrication process on the first wafer. The representative feature has a critical dimension response to a specified process control parameter that is correlated to a critical dimension response to the specified process control parameter of other features within the given area on the first wafer. The process adjustment component 603 is configured to determine an adjustment to the specified process control parameter that will move the measured critical dimension of the representative feature within the given area on the first wafer toward a target critical dimension for the representative feature. The process control component 605 is configured to direct performance of the fabrication process on a second wafer using the adjustment to the specified process control parameter. A configuration of the second wafer upon entering the fabrication process is equal to, i.e., the same as, a configuration of the first wafer upon entering the fabrication process.

In some embodiments, the process controller 163 includes a pre-process geometric parameter data acquisition component 602, along with the process adjustment component 603 and the process control component 605. The pre-process geometric parameter data acquisition component 602 is configured to direct measurement of one or more pre-process geometric parameters $\{\phi_1, \ldots, \phi_{n\_preOCD}\}$ on a wafer before performance of a fabrication process on the wafer. In these embodiments, the process adjustment component 603 is configured to use a process control model (input+control model) to determine a recommended setting of each of one or more process control parameters $\{\rho_1, \ldots, \rho_{n\_cp}\}$ for driving one or more post-process geometric parameters $\{\gamma_1, \ldots, \gamma_{n\_postOCD}\}$ on the wafer to respective target values in view of measured values for the one or more pre-process geometric parameters $\{\phi_1, \ldots, \phi_{n\_preOCD}\}$ on the wafer. The one or more process control parameters $\{\rho_1, \ldots, \rho_{n\_cp}\}$ are controlled during performance of the fabrication process on the wafer. The one or more post-process geometric parameters $\{\gamma_1, \ldots, \gamma_{n\_postOCD}\}$ exist on the wafer after performance of the fabrication process on the wafer. The process control component 605 is configured to direct performance of the fabrication process on the wafer using the recommended setting of each of the one or more process control parameters $\{\rho_1, \ldots, \rho_{n\_cp}\}$. In some embodiments, the process control model (input+control model) specifies a relationship between a set of parametric data and the one or more post-process geometric parameters $\{\gamma_1, \ldots, \gamma_{n\_postOCD}\}$ on the wafer. The set of parametric data includes the one or more pre-process geometric parameters $\{\phi_1, \ldots, \phi_{n\_preOCD}\}$ on the wafer and the one or more process control parameters $\{\rho_1, \ldots, \rho_{n\_cp}\}$.

In some embodiments, the one or more pre-process geometric parameters $\{\phi_1, \ldots, \phi_{n\_preOCD}\}$ on the wafer includes one or more of a dimension of a structure on the wafer, a dimension of hole formed on the wafer, a dimension of a trench formed on the wafer, a thickness of a material layer on the wafer, and an angle of a surface on the wafer relative to a reference direction, among others. In some embodiments, the one or more post-process geometric parameters $\{\gamma_1, \ldots, \gamma_{n\_postOCD}\}$ on the wafer includes one or more of a dimension of a structure on the wafer, a dimension of hole formed on the wafer, a dimension of a trench formed on the wafer, a thickness of a material layer on the wafer, and an angle of a surface on the wafer relative to a reference direction, among others. In some embodiments, the one or more process control parameters $\{\rho_1, \ldots, \rho_{n\_cp}\}$ includes one or more of a temperature, a pressure, a process gas flow rate, a bias voltage, and a radiofrequency power, among others.

In various embodiments, the controller 163 includes a processor 607, a storage hardware unit (HU) 609 (e.g., memory), an input HU 611, an output HU 613, an input/output (I/O) interface 615, an I/O interface 617, a network interface controller (NIC) 619, and a data communication bus 621. The processor 607, the storage HU 609, the input HU 611, the output HU 613, the I/O interface 615, the I/O interface 617, and the NIC 619 can be in data communication with each other by way of the data communication bus 621. The input HU 611 is configured to receive data communication from a number of external devices. Examples of the input HU 611 include a data acquisition system, a data acquisition card, etc. The output HU 613 is configured to transmit data to a number of external devices. An examples of the output HU 613 is a device controller. Examples of the NIC 619 include a network interface card, a network adapter, etc. Each of the I/O interfaces 615 and 617 is defined to provide compatibility between different hardware units coupled to the I/O interface. For example, the I/O interface 615 can be defined to convert a signal received from the input HU 611 into a form, amplitude, and/or speed compatible with the data communication bus 621. Also, the I/O interface 617 can be defined to convert a signal received from the data communication bus 621 into a form, amplitude, and/or speed compatible with the output HU 613. Although various operations are described herein as being performed by the processor 607 of the controller 163, it should be understood that in some embodiments various operations can be performed by multiple processors of the controller 163 and/or by multiple processors of multiple computing systems in data communication with the controller 163.

The controller 163 may be employed to control devices in various wafer fabrication systems based in-part on sensed values. For example, the controller 163 may control one or more of valves 621, filter heaters 623, wafer support structure heaters 625, pumps 627, and other devices 629 based on the sensed values and other control parameters. The controller 163 receives the sensed values from, for example, pressure manometers 631, flow meters 633, temperature sensors 635, and/or other sensors 637. The controller 163 may also be employed to control process conditions during etching and deposition on the wafer(s).

The controller 163 can be configured to execute computer programs including sets of instructions for controlling process timing, process gas delivery system temperature, and pressure differentials, valve positions, mixture of gases, process gas flow rate, chamber pressure, chamber temperature, wafer support structure temperature (wafer temperature), RF power levels, wafer chuck or pedestal position, bias power, and other parameters of a particular process. Other computer programs stored on memory devices associated with the controller 163 may be employed in some embodiments. Typically there will be a user interface associated with the controller 163. The user interface may include a display 639 (e.g., a display screen and/or graphical software displays of the apparatus and/or process conditions), and user input devices 641 such as pointing devices, keyboards, touch screens, microphones, etc.

Software for directing operation of the controller 163 may be designed or configured in many different ways. Computer programs for directing operation of the controller 163 to execute various wafer fabrication processes in a process sequence can be written in any conventional computer readable programming language: for example, assembly language, C, C++, Pascal, Fortran or others. Compiled object code or script is executed by the processor 607 to perform the tasks identified in the program. The controller 163 can be operated to control various process control parameters related to process conditions such as, for example, filter pressure differentials, process gas composition and flow rates, temperature, pressure, plasma conditions, such as RF power levels and RF frequencies, bias voltage(s), cooling gas pressure, and chamber wall temperature, among others. Examples of sensors that may be monitored during the wafer fabrication process include, but are not limited to, mass flow control modules, pressure sensors, such as the pressure manometers 631, and thermocouples located in the wafer support structure, such as the temperature sensors 635. Appropriately programmed feedback and control algorithms may be used with data from these sensors to control/adjust one or more process control parameters to maintain desired process conditions.

In some implementations, the controller 163 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of the wafer. The controller 163 may control various components or subparts of the system or systems. The controller 163, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 163 may be defined as electronics having various integrated circuits, logic, memory, and/or software that receive instructions, issue instructions, control operation, enable wafer processing operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 163 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 163, in some implementations, may be a part of or coupled to a computer that is integrated with, coupled to the system, otherwise networked to the system, or a combination thereof. For example, the controller 163 may be in the "cloud" of all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller 163 receives instructions in the form of data, which specify parameters for each of the processing steps to be performed during one or more operations. It should be understood that the parameters may be specific to the type of process to be performed and the type of tool that the controller 163 is configured to interface with or control. Thus as described above, the controller 163 may be distributed, such as by comprising one or more discrete controllers that are networked together and working towards a common purpose, such as the processes and controls described herein. An example of a distributed controller for such purposes would be one or more integrated circuits on a plasma processing station in communication with one or more integrated circuits located remotely (such as at the platform level or as part of a remote computer) that combine to control a process on the plasma processing station.

Without limitation, example systems that the controller 163 can interface with may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers. As noted above, depending on the process step or steps to be performed by the tool, the controller 163 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Embodiments described herein may also be practiced with various computer system configurations including hand-held hardware units, microprocessor systems, microprocessor-based or programmable consumer electronics, minicomputers, mainframe computers and the like. Embodiments described herein can also be practiced in distributed computing environments where tasks are performed by remote processing hardware units that are linked through a network. It should be understood that the embodiments described herein can employ various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

Various embodiments described herein can be instantiated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes, and other optical and non-optical data storage hardware units. The non-transitory computer-readable medium can include computer-readable tangible medium distributed over a network-coupled computer system so that the computer-readable code is stored and executed in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A method for controlling a semiconductor fabrication process, comprising:
    determining a representative feature within a given area on a wafer, the representative feature having a critical dimension response to a specified process control parameter that is correlated to a critical dimension response to the specified process control parameter of other features within the given area on the wafer;
    evaluating a correlation between a change in a critical dimension of the representative feature and a change in the specified process control parameter;
    determining a critical dimension adjustment of the representative feature to achieve a target critical dimension of the representative feature;
    determining an adjustment to the specified process control parameter by substituting the critical dimension adjustment of the representative feature for the change in the critical dimension of the representative feature in the correlation, wherein the adjustment to the specified process control parameter drives the critical dimension of the representative feature to the target critical dimension of the representative feature; and
    updating a process controller to implement the adjustment to the specified process control parameter during subsequent processing of another wafer.

2. The method as recited in claim 1, wherein the representative feature is either a structure, a combination of structures, a trench, a hole, or a spacing between structures.

3. The method as recited in claim 1, wherein determining the critical dimension adjustment of the representative feature includes measuring the critical dimension of the representative feature on the wafer.

4. The method as recited in claim 1, wherein determining the adjustment to the specified process control parameter includes dividing the critical dimension adjustment of the representative feature by a sensitivity factor, the sensitivity factor representing a sensitivity of the critical dimension of the representative feature to the specified process control parameter.

5. The method as recited in claim 1, wherein the specified process control parameter varies in two dimensions across the wafer.

6. The method as recited in claim 1, wherein the specified process control parameter is one or more of a temperature, a pressure, a process gas flow rate, a bias voltage, and a radiofrequency power.

7. The method as recited in claim 6, wherein the process controller is configured to control power delivery to each of multiple heating components distributed across a wafer support structure.

8. The method as recited in claim 1, further comprising:
    performing a design of experiments on multiple wafers to generate data for evaluating the correlation between the change in the critical dimension of the representative feature and the change in the specified process control parameter, wherein the design of experiments includes performing a same fabrication process on each of the multiple wafers using a different setting of the specified process control parameter for each of the multiple wafers, and measuring the critical dimensions of the representative feature and of the other features within the given area on the wafer on each of the multiple wafers.

9. The method as recited in claim 1, wherein updating the process controller includes accessing data that defines response values of the specified process control parameter as a function of position relative to the wafer for different process input control settings that drive the specified process control parameter.

10. The method as recited in claim 1, wherein the given area on the wafer corresponds to a field of lithographic exposure during fabrication of the wafer.

11. The method as recited in claim 1, wherein the representative feature within the given area on the wafer is determined by performing a covariance analysis on critical dimension responses to the specified process control parameter for the representative feature and the other features within the given area on the wafer.

12. The method as recited in claim 1, wherein a location of the representative feature on the wafer corresponds to a unit cell of a sampling lattice, wherein the sampling lattice is based on a spatial frequency of the specified process control parameter, wherein the spatial frequency of the specified process control parameter is based on a spatial arrangement of devices used to control the specified process control parameter.

13. The method as recited in claim 12, wherein the unit cell of the sampling lattice is sized to a smallest characteristic length over which metrology-sampled on-wafer feature dimension values are expected to change.

14. The method as recited in claim 13, wherein the smallest characteristic length is measured in either an x-direction or a y-direction on the wafer.

15. The method as recited in claim 13, wherein the sampling lattice is a hexagonal lattice, and wherein the unit cell of the sampling lattice is sized to tangentially contact a circle having a diameter equal to the smallest characteristic length.

16. A process controller for controlling a semiconductor fabrication process, comprising:
    a critical dimension determination component configured to obtain a measurement of a critical dimension of a representative feature within a given area on a first wafer after completion of a fabrication process on the first wafer, the representative feature having a critical dimension response to a specified process control parameter that is correlated to a critical dimension response to the specified process control parameter of other features within the given area on the first wafer;
    a process adjustment component configured to determine an adjustment to the specified process control parameter that will move the measurement of the critical dimension of the representative feature within the given area on the first wafer toward a target critical dimension for the representative feature, wherein the process adjustment component evaluates a correlation between a change in the critical dimension of the representative feature and a change in the specified process control parameter, wherein the process adjustment component determines a critical dimension adjustment of the representative feature to achieve the target critical dimension for the representative feature, and wherein the process adjustment component determines the adjustment to the specified process control parameter by substituting the critical dimension adjustment of the representative feature for the change in the critical dimension of the representative feature in the correlation; and a process control component configured to direct performance of the fabrication process on a second wafer using the adjustment to the specified process control parameter, wherein a configuration of the second wafer upon entering the fabrication process is equal to a configuration of the first wafer upon entering the fabrication process.

* * * * *